US010487400B2

(12) United States Patent
Reier et al.

(10) Patent No.: US 10,487,400 B2
(45) Date of Patent: Nov. 26, 2019

(54) METHOD OF DECREASING VISIBLE FLICKERING EFFECTS IN A LIGHT EMITTING DIODE ARRAY OPERATED BY PULSE WIDTH MODULATED SIGNALS (71) Applicant: Lear Corporation, Southfield, MI (US)

(72) Inventors: Michael Reier, Pressig (DE); Andreas Töpfer, Kronach (DE); Stefan Klinger, Sindelfingen (DE)

(73) Assignee: Lear Corporation, Southfield, MI (US)

(*) Notice: Subject to any disclaimer, the term of this patent is extended or adjusted under 35 U.S.C. 154(b) by 0 days.

(21) Appl. No.: 16/214,884

(22) Filed: Dec. 10, 2018

(65) Prior Publication Data
US 2019/0194808 A1 Jun. 27, 2019

(30) Foreign Application Priority Data
Dec. 22, 2017 (DE) .................. 10 2017 223 741

(51) Int. Cl.
H05B 33/08 (2006.01)
H05B 37/02 (2006.01)
C23C 16/455 (2006.01)
C23C 16/48 (2006.01)
H01L 21/311 (2006.01)
C23C 16/56 (2006.01)
H01L 21/02 (2006.01)
C23C 16/50 (2006.01)

(52) U.S. Cl.
CPC .. C23C 16/45536 (2013.01); C23C 16/45544 (2013.01); C23C 16/482 (2013.01); C23C 16/50 (2013.01); C23C 16/56 (2013.01); H01L 21/0228 (2013.01); H01L 21/31144 (2013.01)

(58) Field of Classification Search
None
See application file for complete search history.

(56) References Cited

U.S. PATENT DOCUMENTS 7,321,203 B2 1/2008 Marosek
9,468,069 B2 10/2016 Lee
(Continued)

FOREIGN PATENT DOCUMENTS

DE 102010000672 A1 7/2011

OTHER PUBLICATIONS

German Office Action, Application No. 102017223741.4 dated Sep. 12, 2018.

Primary Examiner — Dedei K Hammond
(74) Attorney, Agent, or Firm — MacMillan, Sobanski & Todd, LLC (57) ABSTRACT A method of changing the brightness of light emitted by first and second light emitting diodes (LEDs) operated by respective first and second pulse width modulation (PWM) control signals includes the steps of (a) changing a first PWM control signal that operates a first LED from a first initial PWM value at a first rate of change to achieve a threshold PWM value at a predetermined point in time; (b) changing a second PWM control signal that operates a second LED from a second initial PWM value at a second rate of change to achieve the threshold PWM value at the predetermined point in time; and (c) subsequent to the predetermined time, changing both the first PWM control signal and the second PWM control signal from the threshold PWM value to achieve a final PWM value.

12 Claims, 8 Drawing Sheets (56) References Cited

U.S. PATENT DOCUMENTS

2014/0111110 A1    4/2014  Qi et al.
2015/0076999 A1*   3/2015  Malinin ............ H05B 33/0815
                                                       315/186
2015/0319816 A1*  11/2015  Chen ................... H05B 39/044
                                                       315/210

* cited by examiner

METHOD OF DECREASING VISIBLE FLICKERING EFFECTS IN A LIGHT EMITTING DIODE ARRAY OPERATED BY PULSE WIDTH MODULATED SIGNALS

BACKGROUND OF THE INVENTION

This invention relates in general to electronic circuits for operating arrays of light emitting diodes (LEDs). In particular, this invention relates to an improved method of decreasing visible flickering effects in an LED array that is operated by pulse width modulated control signals.

LEDs are commonly used as sources of light in a variety of applications, including vehicles (such as for headlights, taillights, signal lights, and brake lights, for example) and other devices. Typically, each of such LEDs in an array is selectively connected through a switching element to a source of electrical energy. When the switching element is closed, the associated LED is connected to the source of electrical energy. As a result, electrical current flows through the LED, causing it to emit light. Conversely, when the switching element is opened, the associated LED is not connected to the source of electrical energy. As a result, electrical current does not flow through the LED, causing it to not emit light. The closing and opening of each switching element is usually controlled by an electronic controller, which generates electrical control signals to the switching element. In response to such electrical control signals, the switching element is selectively closed and opened to operate the associated LED in a desired manner.

The brightness of light emitted by the LED is directly related to the amount of electrical current that flows therethrough. The amount of electrical current that flows through the LED can be controlled by varying the duty cycle of a pulse width modulated (PWM) electrical control signal supplied to the switching element. When the duty cycle of the PWM electrical control signal is relatively short, a relatively small amount of electrical current flows through the LED, and the LED will emit a relatively low brightness of light. Conversely, when the duty cycle of the PWM electrical control signal is relatively long, a relatively large amount of electrical current flows through the LED, and the LED will emit a relatively high brightness of light.

In some instances, it may be desirable to change the amount of the brightness of light emitted by the LEDs. For example, in the context of a vehicle headlight, it may be desirable to dim the amount of the brightness of light emitted by the LEDs from a relatively high brightness of light to a relatively low brightness of light when the presence of oncoming traffic is detected. To accomplish this, the duty cycle of the PWM electrical control signal is transitioned from an initial relatively large magnitude to a final relatively small magnitude.

It is known that transitioning between different levels of brightness of light can result in visible flickering of the LEDs if the following conditions are present: (1) the LEDs are transitioning in the same manner (e.g., are all dimming); (2) the LEDs are physically adjacent or near each other in an LED array; and (3) the LEDs have different dimming rates of change. Flickering is caused by modifications of brightness in relation to the modified brightness of neighboring LEDs. One solution for minimizing these undesirable flickering effects would be to increase the frequency at which the pulses of the PWM electrical control signal are sent to the switching element, thereby increasing the speed at which the switching element is to be opened and closed. However, increasing the frequency at which the pulses of the PWM electrical control signal are sent to the switching element can undesirably increase the cost of the electronic controller. Thus, it would be desirable to provide an improved method of dimming LEDs operated by a pulse width modulated control signal that reduces visible flickering effects, while being simple and inexpensive to implement.

SUMMARY OF THE INVENTION

This invention relates to an improved method of changing the brightness of light emitted by first and second light emitting diodes (LEDs) operated by respective first and second pulse width modulation (PWM) control signals. Initially, a first PWM control signal that operates a first LED is changed from a first initial PWM value at a first rate of change to achieve a threshold PWM value at a predetermined point in time. At the same time, a second PWM control signal that operates a second LED is changed from a second initial PWM value at a second rate of change to achieve the threshold PWM value at the predetermined point in time. Subsequent to the predetermined time, both the first PWM control signal and the second PWM control signal are changed from the threshold PWM value to achieve a final PWM value.

Various aspects of this invention will become apparent to those skilled in the art from the following detailed description of the preferred embodiments, when read in light of the accompanying drawings.

DETAILED DESCRIPTION OF THE PREFERRED EMBODIMENTS

Figure 1:
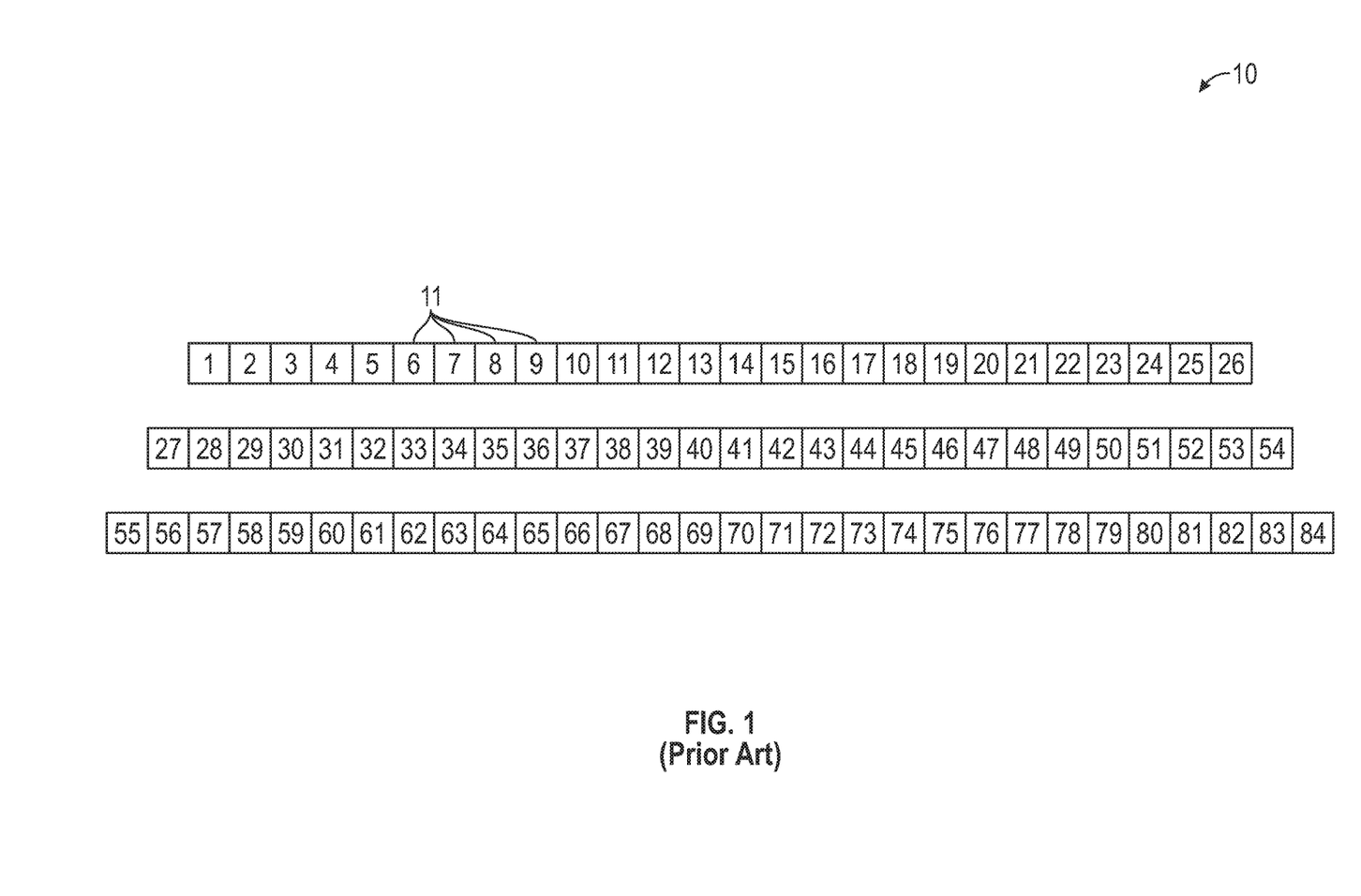
FIG. 1 is a block diagram of a conventional LED array that may be operated in accordance with the method of this invention.

Referring now to the drawings, there is illustrated in FIG. 1 a block diagram of a conventional LED array, indicated generally at 10, that may be operated in accordance with the method of this invention. The illustrated LED array 10 includes eighty-four individual LEDs 11 and may, for example, be part of a vehicular lighting device, such as a headlight, taillight, signal light, brake light, or similar device. However, the LED array 10 is intended merely to illustrate one environment in which this invention may be practiced. Thus, the scope of this invention is not intended to be limited for use with the specific structure for the LED array 10 illustrated in FIG. 1 or with LED arrays in general. On the contrary, as will become apparent below, this invention may be used in any desired environment for the purposes described below.

Figure 2:
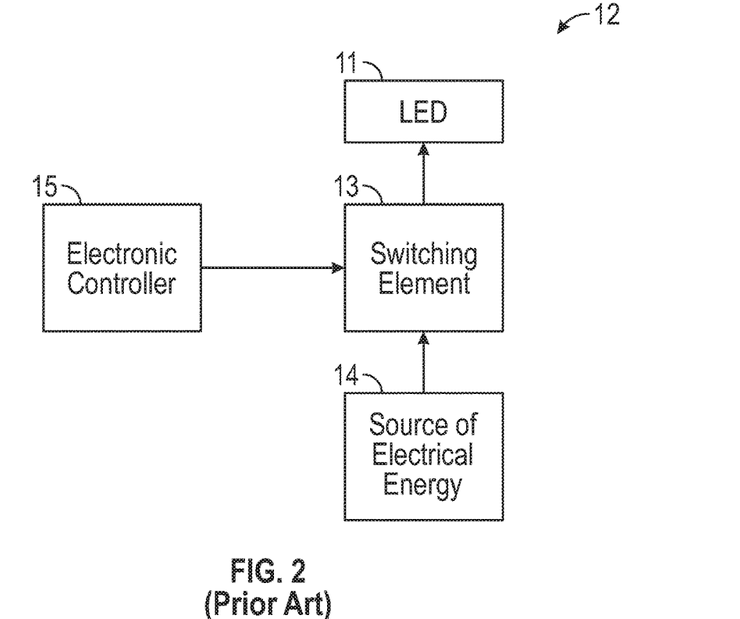
FIG. 2 is a block diagram of a conventional electronic circuit for operating individual ones of the LEDs contained in the conventional LED array shown in FIG. 1 in accordance with the method of this invention.

FIG. 2 is a block diagram of a conventional electronic circuit, indicated generally at 12, for operating individual ones of the LEDs 11 contained in the conventional LED array 12 shown in FIG. 1 in accordance with the method of this invention. The basic structure of the electronic circuit 12 is conventional in the art and includes a switching element 13 that is connected between the LED 11 and a source of electrical energy 14. In a manner that is well known in the art, when the switching element 13 is closed, the LED 11 is connected to the source of electrical energy 14. As a result, electrical current flows from the source of electrical energy 14 through the LED 11, causing it to emit light. Conversely, when the switching element 13 is opened, the LED 11 is not connected to the source of electrical energy 14. As a result, electrical current does not flow through the LED 11, causing it to not emit light. Although this invention will be described in the illustrated embodiment of the switching element 13 being directly connected between the LED 11 and the source of electrical energy 14, it will be appreciated that the switching element 13 may be arranged to selectively cause the source of electrical energy 14 to operate the LED 11 in any other desired manner including, for example, being connected in parallel with the LED 11 and the like.

The closing and opening of the switching element 13 is controlled by an electronic controller 15. The electronic controller 15 is, of itself, conventional in the art and generates electrical control signals to the switching element 13. In response to such control signals, the switching element 13 is selectively actuated to be opened and closed to operate the LED 11 in a desired manner, as described above. As also described above, the brightness of light emitted by the LED 11 is directly related to the amount of electrical current that flows therethrough. Thus, a user may provide input signals to the electronic controller 15 that, in turn, operates the switching element 13 in accordance with the user's request to achieve a desired brightness of light emitted by the LED 11.

Figure 3:
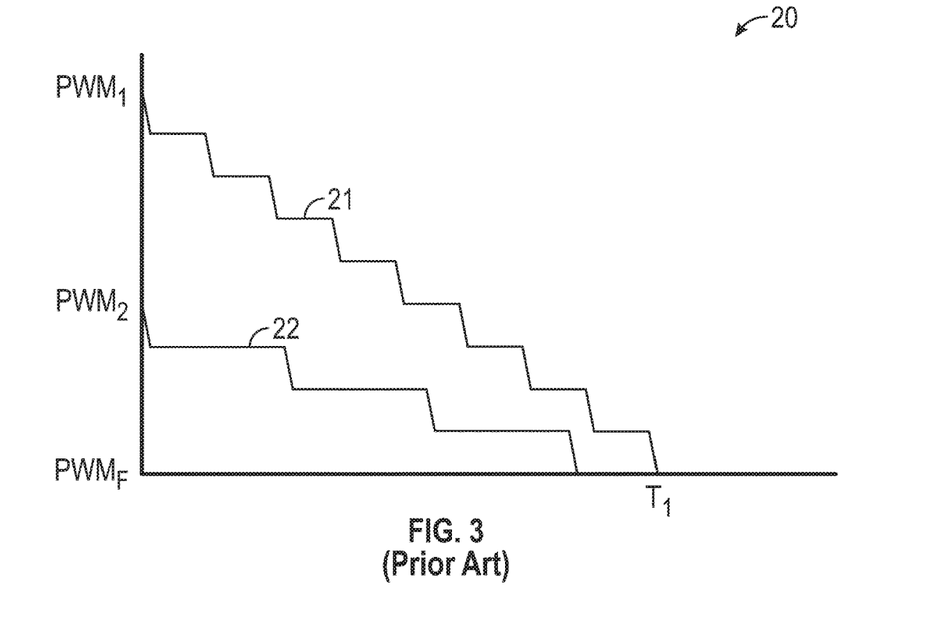
FIG. 3 is a graph that illustrates a conventional method of operating the LED array and the electronic circuit shown in FIGS. 1 and 2.

FIG. 3 is a graph, indicated generally at 20, that illustrates a conventional method of operating the LED array 10 shown in FIG. 1 and the electronic circuit 12 shown in FIG. 2. More specifically, the graph 20 illustrates how, in a known manner, two of the individual LEDs 11 contained in the LED array 10 shown in FIG. 1 are dimmed from respective first and second initial duty cycle values $PWM_1$ and $PWM_2$ (represented on the vertical axis of the graph 20) to a single final duty cycle value $PWM_F$ as a function of time (represented on the horizontal axis of the graph 20). A first plot line 21 in the graph 20 illustrates how a first one of the LEDs 11 is dimmed from the first initial duty cycle value $PWM_1$ to the final duty cycle value $PWM_F$, while a second plot line 22 in the graph 20 illustrates how a second one of the LEDs 11 is dimmed from the second initial duty cycle value $PWM_2$ to the same final duty cycle value $PWM_F$. The first initial duty cycle value $PWM_1$ is larger than the second initial duty cycle value $PWM_2$.

In the conventional method of operating the LED array 10 shown in FIG. 3, the rate at which the first one of the LEDs 11 is dimmed is uniform from the first initial duty cycle value $PWM_1$ to the final duty cycle value $PWM_F$ (the final duty cycle value $PWM_F$ may be zero, which means that the LED 11 is turned completely off). Thus, the first plot line 21 in the graph 20 shows a linear decrease over time from the first initial duty cycle value $PWM_1$ to the final duty cycle value $PWM_F$. Similarly, the rate at which the second one of the LEDs 11 is dimmed is also uniform from the second initial duty cycle value $PWM_2$ to the final duty cycle value $PWM_F$. Thus, the second plot line 22 in the graph 20 also shows a linear decrease over time from the second initial duty cycle value $PWM_2$ to the final duty cycle value $PWM_F$. The rates of decrease of the duty cycle values of the first and second ones of the LEDs 11 are selected such that they achieve the final duty cycle value $PWM_F$ at approximately the same point in time $T_1$ (which is preferred in order to avoid certain undesirable visual effects). In order to accomplish this, the first LED 11 is dimmed at a relatively fast rate in comparison to a relatively slow rate at which the second LED 11 is dimmed. Although this method has been effective, it is known to cause undesirable flickering effects, as discussed above.

Figure 4:
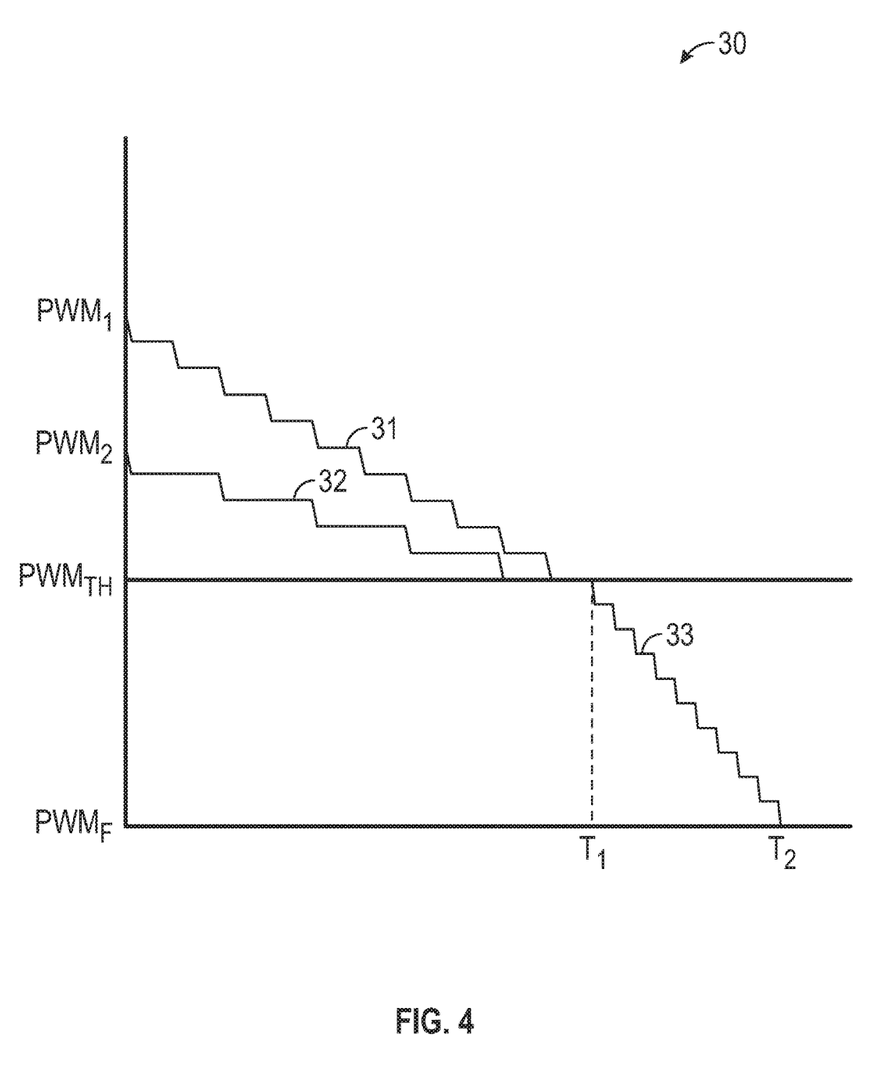
FIG. 4 is a graph that illustrates a first embodiment of a method of operating the LED array and the electronic circuit shown in FIGS. 1 and 2 in accordance with this invention.

FIG. 4 is a graph, indicated generally at 30, that illustrates a first embodiment of a method of operating the LED array 10 and the electronic circuit 12 shown in FIGS. 1 and 2 in accordance with this invention. More specifically, the graph 30 illustrates how two of the individual LEDs 11 contained in the LED array 10 shown in FIG. 1 can be dimmed from respective first and second initial duty cycle values $PWM_1$ and $PWM_2$ (represented on the vertical axis of the graph 30) to a single final duty cycle value $PWM_F$ as a function of time (represented on the horizontal axis of the graph 30) in an improved manner to avoid the occurrence of the undesirable visual effects noted above. A first plot line 31 in the graph 30 illustrates how a first one of the LEDs 11 is dimmed from the first initial duty cycle value $PWM_1$ to the final duty cycle value $PWM_F$, while a second plot line 32 in the graph 30 illustrates how a second one of the LEDs 11 is dimmed from the second initial duty cycle value $PWM_2$ to the same final duty cycle value $PWM_F$. The first initial duty cycle value $PWM_1$ is larger than the second initial duty cycle value $PWM_2$.

In the first embodiment of the method of operating the LED array 10 shown in FIG. 4, the initial rate at which the first one of the LEDs 11 is dimmed is uniform from the first initial duty cycle value $PWM_1$ to a threshold duty cycle value $PWM_{TH}$ that is greater than the final duty cycle value $PWM_F$. Thus, the initial portion of the first plot line 31 in the graph 30 shows a linear decrease over time from the first initial duty cycle value $PWM_1$ to the threshold duty cycle value $PWM_{TH}$. Similarly, the initial rate at which the second one of the LEDs 11 is dimmed is uniform from the second initial duty cycle value $PWM_2$ to the threshold duty cycle value $PWM_{TH}$. Thus, the initial portion of the second plot line 32 in the graph 30 shows a linear decrease over time from the second initial duty cycle value $PWM_2$ to the threshold duty cycle value $PWM_{TH}$. The rates of decrease of the duty cycle values of the first and second ones of the LEDs 11 are selected such that they achieve the threshold duty cycle value $PWM_{TH}$ at approximately the same point in time $T_1$. In order to accomplish this, the first LED 11 is dimmed at a relatively fast rate in comparison to a relatively slow rate at which the second LED 11 is dimmed. However, the value of the threshold duty cycle value $PWM_{TH}$ is preferably sufficiently high such that the occurrence of the undesirable flickering effects described above is substantially minimized or prevented.

Thereafter, as shown by a third plot line 33 in the graph 30, both the first and second ones of the LEDs 11 are simultaneously dimmed at the same uniform rate from the threshold duty cycle value $PWM_{TH}$ at the point in time $T_1$ to the final duty cycle value $PWM_F$ at a point in time $T_2$. Because the PWM duty cycle values of both the first and second LEDs 11 are simultaneously dimmed at this subsequent uniform rate below the threshold duty cycle value $PWM_{TH}$, the occurrence of the undesirable flickering effects described above is again substantially minimized or prevented. The subsequent uniform rate at which the PWM duty cycle values of the first and second LEDs 11 are simultaneously dimmed (as shown by the third plot line 33 in the graph 30) may be selected as desired. For example, this subsequent uniform rate may be either equal to the rate at which the first one of the LEDs 11 was dimmed (as shown by the first plot line 31 in the graph 30), equal to the rate at which the second one of the LEDs 11 was dimmed (as shown by the second plot line 32 in the graph 30), or equal to any other desired rate.

Figure 5:
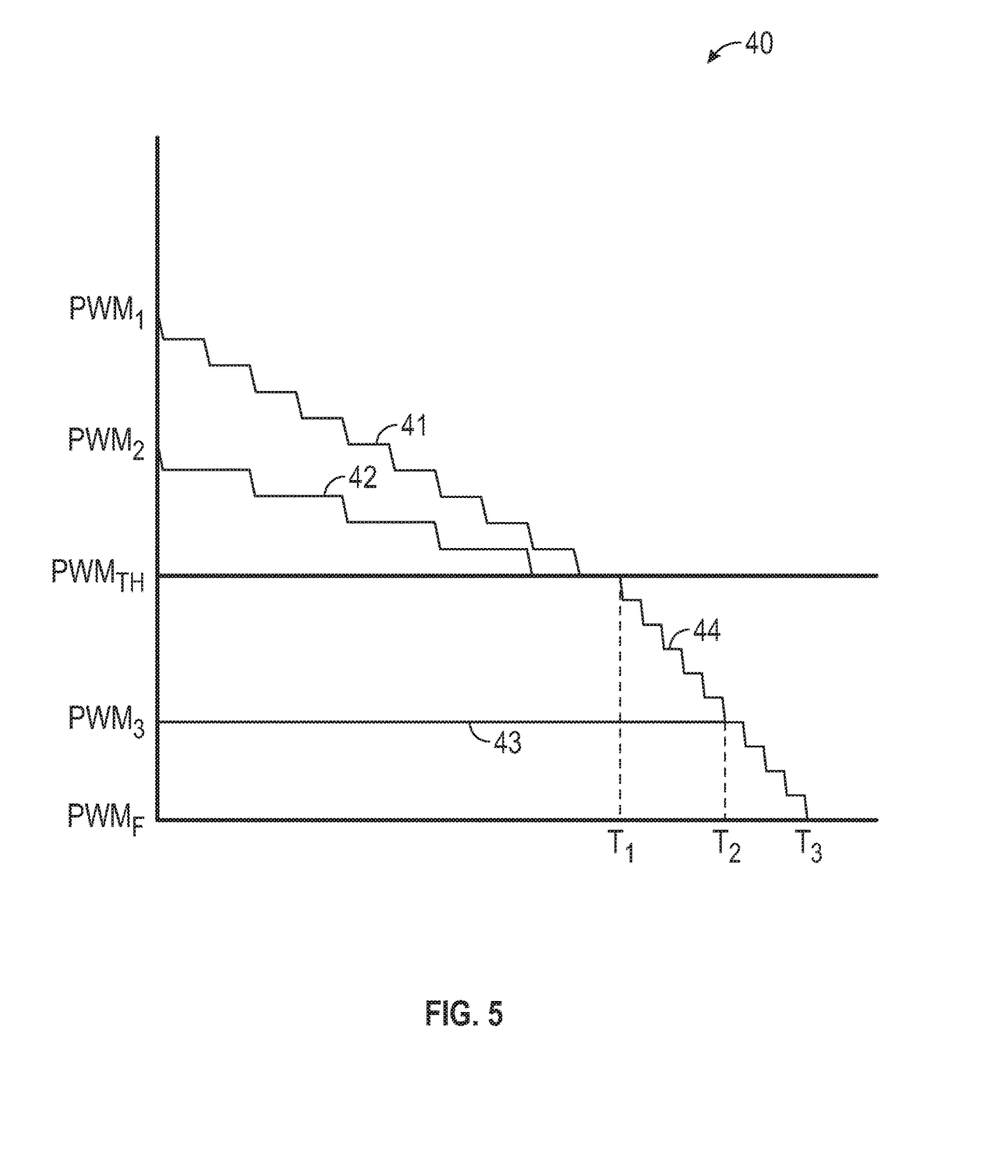
FIG. 5 is a graph that illustrates a second embodiment of a method of operating the LED array and the electronic circuit shown in FIGS. 1 and 2 in accordance with this invention.

FIG. 5 is a graph, indicated generally at 40, that illustrates a second embodiment of a method of operating the LED array 10 and the electronic circuit 12 shown in FIGS. 1 and 2 in accordance with this invention. More specifically, the graph 40 illustrates how three of the individual LEDs 11 contained in the LED array 10 shown in FIG. 1 can be dimmed from respective first, second, and third initial duty cycle values $PWM_1$, $PWM_2$, and $PWM_3$ (represented on the vertical axis of the graph 40) to a single final duty cycle value $PWM_F$ as a function of time (represented on the horizontal axis of the graph 40) in an improved manner to avoid the occurrence of the undesirable visual effects noted above. A first plot line 41 in the graph 40 illustrates how a first one of the LEDs 11 is dimmed from the first initial duty cycle value $PWM_1$ to a threshold duty cycle value $PWM_{TH}$ that is greater than the final duty cycle value $PWM_F$. A second plot line 42 in the graph 40 illustrates how a second one of the LEDs 11 is dimmed from the second initial duty cycle value $PWM_2$ to the same final duty cycle value $PWM_F$. A third plot line 43 in the graph 40 illustrates how a third one of the LEDs 11 is dimmed from the third initial duty cycle value $PWM_3$ to the same threshold duty cycle value $PWM_{TH}$. The first initial duty cycle value $PWM_1$ is larger than the second initial duty cycle value $PWM_2$, and the second initial duty cycle value $PWM_2$ is larger than the third initial duty cycle value $PWM_3$.

In the second embodiment of the method of operating the LED array 10 shown in FIG. 5, the initial rate at which the first one of the LEDs 11 is dimmed is uniform from the first initial duty cycle value $PWM_1$ to a threshold duty cycle value $PWM_{TH}$ that is greater than the final duty cycle value $PWM_F$. Thus, the initial portion of the first plot line 41 in the graph 40 shows a linear decrease over time from the first initial duty cycle value $PWM_1$ to the threshold duty cycle value $PWM_{TH}$. Similarly, the initial rate at which the second one of the LEDs 11 is dimmed is uniform from the second initial duty cycle value $PWM_2$ to the threshold duty cycle value $PWM_{TH}$. Thus, the initial portion of the second plot line 42 in the graph 40 shows a linear decrease over time from the second initial duty cycle value $PWM_2$ to the threshold duty cycle value $PWM_{TH}$. Lastly, because the third initial duty cycle value $PWM_3$ is less than the threshold duty cycle value $PWM_{TH}$, the initial rate at which the third one of the LEDs 11 is dimmed is equal to zero (i.e., the third one of the LEDs 11 is not initially dimmed). Thus, the initial portion of the third plot line 43 in the graph 40 shows no decrease over time from the third initial duty cycle value $PWM_3$.

The rates of decrease of the duty cycle values of the first and second ones of the LEDs 11 are selected such that they achieve the threshold duty cycle value $PWM_{TH}$ at approximately the same point in time $T_1$. In order to accomplish this, the first LED 11 is dimmed at a relatively fast rate in comparison to a relatively slow rate at which the second LED 11 is dimmed. However, the value of the threshold duty cycle value $PWM_{TH}$ is preferably sufficiently high such that the occurrence of the undesirable flickering effects described above is substantially minimized or prevented.

Thereafter, as shown by a fourth plot line 44 in the graph 40, both the first and second ones of the LEDs 11 are simultaneously dimmed at the same uniform rate from the threshold duty cycle value $PWM_{TH}$ to the final duty cycle value $PWM_F$. Because the PWM duty cycle values of both the first and second LEDs 11 are simultaneously dimmed at this subsequent uniform rate below the threshold duty cycle value $PWM_{TH}$, the occurrence of the undesirable flickering effects described above is again substantially minimized or prevented. The subsequent uniform rate at which the PWM duty cycle values of the first and second LEDs 11 are simultaneously dimmed (as shown by the fourth plot line 44 in the graph 40) may be selected as desired. For example, this subsequent uniform rate may be either equal to the rate at which the first one of the LEDs 11 was dimmed (as shown by the first plot line 41 in the graph 40), equal to the rate at which the second one of the LEDs 11 was dimmed (as shown by the second plot line 42 in the graph 40), or equal to any other desired rate.

As further shown in FIG. 5, the PWM duty cycle values of the first and second LEDs 11 are eventually simultaneously dimmed to the third initial duty cycle value $PWM_3$ at a point in time $T_2$. Thereafter, as shown by the fourth plot line 44 in the graph 40, all of the first, second, and third ones of the LEDs 11 are simultaneously dimmed at the same uniform rate to the final duty cycle value $PWM_F$ at a point in time $T_3$. Because the PWM duty cycle values of the first, second, and third ones of the LEDs 11 are simultaneously dimmed at this subsequent uniform rate below the threshold duty cycle value $PWM_{TH}$, the occurrence of the undesirable flickering effects described above is again substantially minimized or prevented.

Figure 6:
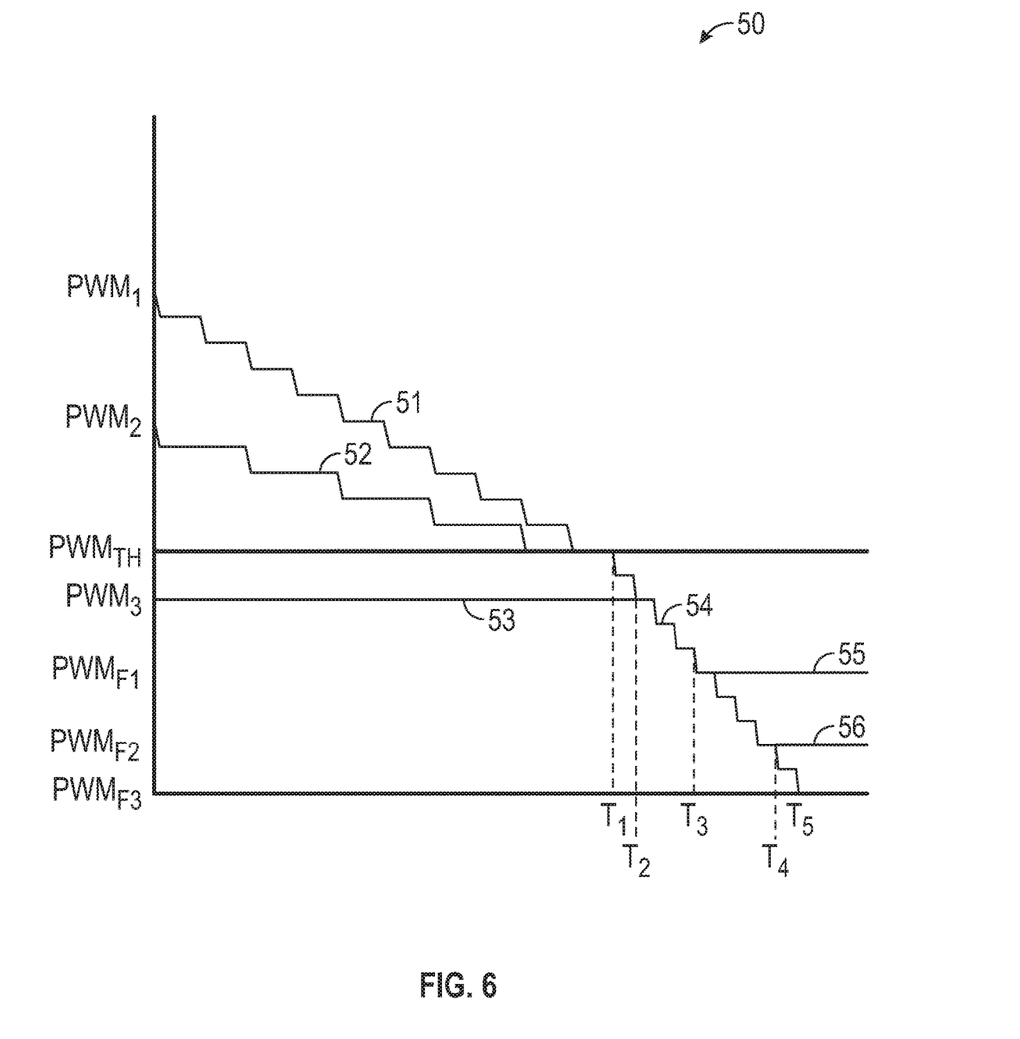
FIG. 6 is a graph that illustrates a third embodiment of a method of operating the LED array and the electronic circuit shown in FIGS. 1 and 2 in accordance with this invention.

FIG. 6 is a graph, indicated generally at 50, that illustrates a third embodiment of a method of operating the LED array 10 and the electronic circuit 12 shown in FIGS. 1 and 2 in accordance with this invention. More specifically, the graph 50 illustrates how three of the individual LEDs 11 contained in the LED array 10 shown in FIG. 1 can be dimmed from respective first, second, and third initial duty cycle values $PWM_1$, $PWM_2$, and $PWM_3$ (represented on the vertical axis of the graph 50) to a plurality of different final duty cycle values $PWM_{F1}$, $PWM_{F2}$, and $PWM_{F3}$ as a function of time (represented on the horizontal axis of the graph 50) in an improved manner to avoid the occurrence of the undesirable visual effects noted above. A first plot line 51 in the graph 50 illustrates how a first one of the LEDs 11 is dimmed from the first initial duty cycle value $PWM_1$ to the final duty cycle value $PWM_{F1}$. A second plot line 52 in the graph 50 illustrates how a second one of the LEDs 11 is dimmed from the second initial duty cycle value $PWM_2$ to the final duty cycle value $PWM_{F2}$. A third plot line 53 in the graph 50 illustrates how a third one of the LEDs 11 is dimmed from the third initial duty cycle value $PWM_3$ to the final duty cycle value $PWM_{F3}$. The first initial duty cycle value $PWM_1$ is larger than the second initial duty cycle value $PWM_2$, and the second initial duty cycle value $PWM_2$ is larger than the third initial duty cycle value $PWM_3$.

As mentioned above, the third embodiment of the method of operating the LED array 10 shown in FIG. 6 differs from the second embodiment of the method of operating the LED array 10 shown in FIG. 5 only in that the LEDs 11 contained in the LED array 10 shown in FIG. 1 can be dimmed to a plurality of different final duty cycle values $PWM_{F1}$, $PWM_{F2}$, and $PWM_{F3}$. Thus, that portion of the discussion of the second embodiment of the method of operating the LED array 10 shown in FIG. 5 will not be repeated, and like reference numbers (incremented by ten) are used in FIG. 6.

As shown in FIG. 6, all of the first, second, and third ones of the LEDs 11 are simultaneously dimmed at the same uniform rate starting at a point in time $T_2$. Because the PWM duty cycle values of the first, second, and third ones of the LEDs 11 are simultaneously dimmed at this subsequent uniform rate below the threshold duty cycle value $PWM_{TH}$, the occurrence of the undesirable flickering effects described above is again substantially minimized or prevented. However, in this third embodiment, one of the LEDs is caused to cease dimming at a point in time $T_3$ at its final duty cycle value $PWM_{F1}$, as shown by the plot line 55. Similarly, another one of the LEDs is caused to cease dimming at a point in time $T_4$ at its final duty cycle value $PWM_{F2}$, as shown by the plot line 56. Finally, the remaining one of the LEDs 11 is dimmed to the final duty cycle value $PWM_{F3}$ at a point in time $T_5$.

Figure 7:
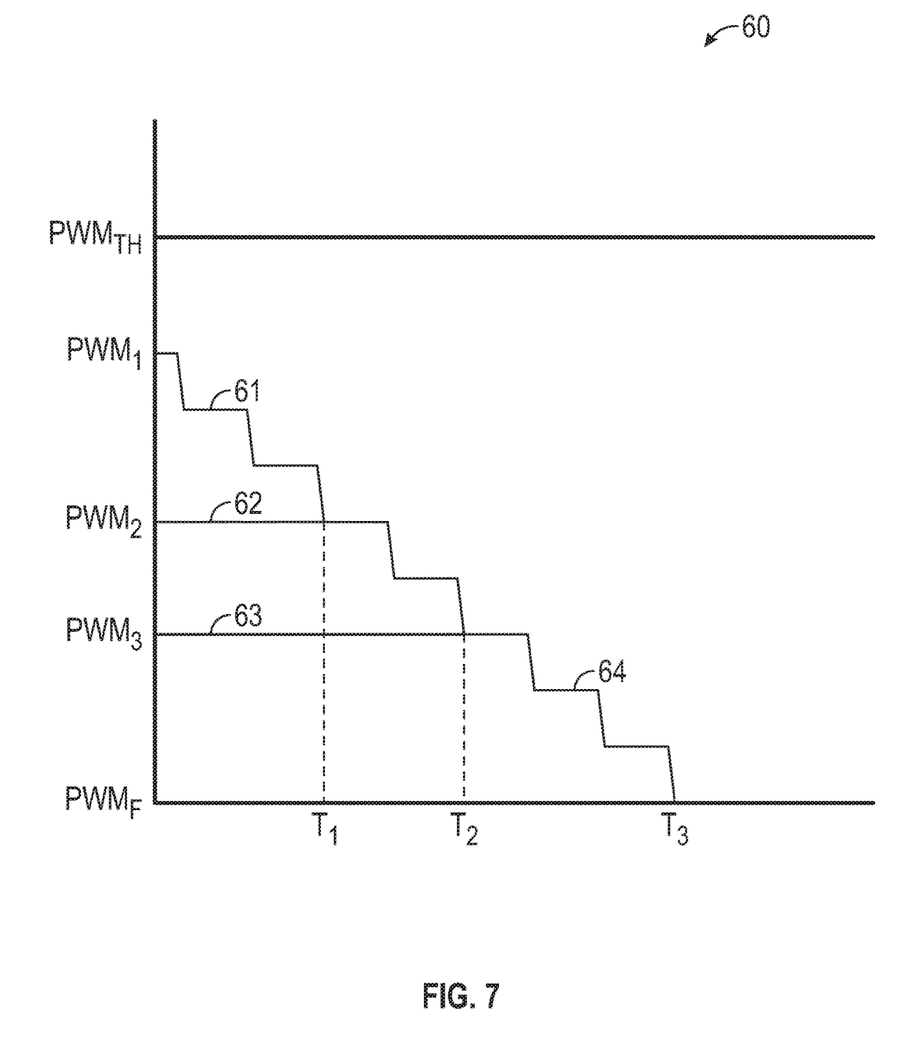
FIG. 7 is a graph that illustrates a fourth embodiment of a method of operating the LED array and the electronic circuit shown in FIGS. 1 and 2 in accordance with this invention.

FIG. 7 is a graph, indicated generally at 60, that illustrates a fourth embodiment of a method of operating the LED array 10 and the electronic circuit 12 shown in FIGS. 1 and 2 in accordance with this invention. More specifically, the graph 60 illustrates how three of the individual LEDs 11 contained in the LED array 10 shown in FIG. 1 can be dimmed from respective first, second, and third initial duty cycle values $PWM_1$, $PWM_2$, and $PWM_3$ (represented on the vertical axis of the graph 60) to a single final duty cycle value $PWM_F$ as a function of time (represented on the horizontal axis of the graph 40) in an improved manner to avoid the occurrence of the undesirable visual effects noted above. A first plot line 61 in the graph 60 illustrates how a first one of the LEDs 11 is dimmed from the first initial duty cycle value $PWM_1$ to the final duty cycle value $PWM_F$. A second plot line 62 in the graph 60 illustrates how a second one of the LEDs 11 is dimmed from the second initial duty cycle value $PWM_2$ to the same final duty cycle value $PWM_F$. A third plot line 63 in the graph 60 illustrates how a third one of the LEDs 11 is dimmed from the third initial duty cycle value $PWM_3$ to the same final duty cycle value $PWM_F$. The first initial duty cycle value $PWM_1$ is larger than the second initial duty cycle value $PWM_2$, and the second initial duty cycle value $PWM_2$ is larger than the third initial duty cycle value $PWM_3$.

In this fourth embodiment of the invention, all of the first, second, and third initial duty cycle values $PWM_1$, $PWM_2$, and $PWM_3$ are below the threshold duty cycle value $PWM_{TH}$. Initially, the duty cycle of the first one of the LEDs 11 is decreased from the first initial duty cycle value $PWM_1$, while the duty cycles of the second and third ones of the LEDs 11 are each maintained at a constant value. This continues until the value of the duty cycle of the first one of the LEDs 11 achieves the value of the duty cycle of the second one of the LEDs 11 at a point in time $T_1$. When that occurs, the duty cycle of the second one of the LEDs 11 is decreased simultaneously with the duty cycle of the first one of the LEDs 11, while the duty cycle of the third one of the LEDs 11 is maintained at a constant value. This continues until the values of the duty cycles of the first and second ones of the LEDs 11 achieve the value of the duty cycle of the third one of the LEDs 11 at a point in time $T_2$. When that occurs, the duty cycle of the third one of the LEDs 11 is decreased simultaneously with the first and second ones of the LEDs 11 until all of the values of the duty cycles of the first, second, and third ones of the LEDs 11 achieve the value of the final PWM duty cycle value $PWM_F$ at a point in time $T_3$.

Figure 8:
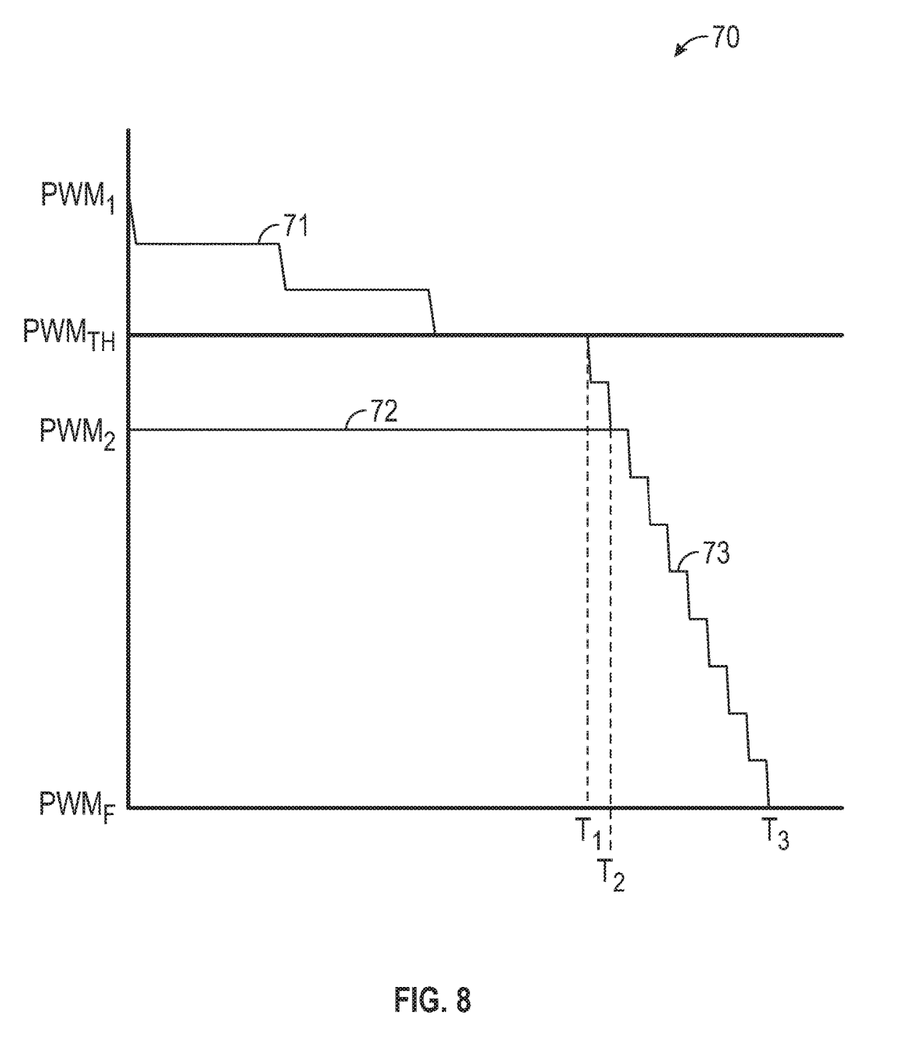
FIG. 8 is a graph that illustrates a fifth embodiment of a method of operating the LED array and the electronic circuit shown in FIGS. 1 and 2 in accordance with this invention.

FIG. 8 is a graph, indicated generally at 70, that illustrates a fifth embodiment of a method of operating the LED array 10 and the electronic circuit 12 shown in FIGS. 1 and 2 in accordance with this invention. More specifically, the graph 70 illustrates how two of the individual LEDs 11 contained in the LED array 10 shown in FIG. 1 can be dimmed from respective first and second initial duty cycle values $PWM_1$ and $PWM_2$ (represented on the vertical axis of the graph 70) to a single final duty cycle value $PWM_F$ as a function of time (represented on the horizontal axis of the graph 70) in an improved manner to avoid the occurrence of the undesirable visual effects noted above. A first plot line 71 in the graph 70 illustrates how a first one of the LEDs 11 is dimmed from the first initial duty cycle value $PWM_1$ to the final duty cycle value $PWM_F$, while a second plot line 72 in the graph 70 illustrates how a second one of the LEDs 11 is dimmed from the second initial duty cycle value $PWM_2$ to the same final duty cycle value $PWM_F$. The first initial duty cycle value $PWM_1$ is greater than the second initial duty cycle value $PWM_2$.

In the fifth embodiment of the method of operating the LED array 10 shown in FIG. 8, the initial rate at which the first one of the LEDs 11 is dimmed is uniform from the first initial duty cycle value $PWM_1$ to a threshold duty cycle value $PWM_{TH}$ that is greater than the final duty cycle value $PWM_F$. Thus, the initial portion of the first plot line 71 in the graph 70 shows a linear decrease over time from the first initial duty cycle value $PWM_1$ to the threshold duty cycle value $PWM_{TH}$. This continues until the value of the duty cycle of the first one of the LEDs 11 achieves the value of the threshold duty cycle value $PWM_{TH}$ at a point in time $T_1$. However, because the second initial duty cycle value $PWM_2$ is less than the threshold duty cycle value $PWM_{TH}$, the initial rate at which the second one of the LEDs 11 is dimmed is equal to zero (i.e., the second one of the LEDs 11 is not dimmed). Thus, the initial portion of the second plot line 72 in the graph 70 shows no decrease over time from the second initial duty cycle value $PWM_2$.

After the value of the duty cycle of the first one of the LEDs 11 achieves the value of the threshold duty cycle value $PWM_{TH}$ at the point in time $T_1$, the first one of the LEDs 11 is continued to be dimmed, but at a subsequent rate that is greater than the initial rate, as shown by a third plot line 73 in the graph 70. The subsequent rate at which the PWM duty cycle value of the first LED 11 is dimmed may be selected as desired. As further shown in FIG. 8, the PWM duty cycle value of the first LED 11 is eventually dimmed to the second initial duty cycle value $PWM_2$ at a point in time $T_2$. Thereafter, as shown by the third plot line 73 in the graph 70, the values of the duty cycles of both of first and second ones of the LEDs 11 are simultaneously dimmed at the same uniform rate to the final duty cycle value $PWM_F$ at a point in time $T_3$. Because the duty cycle values of the first and second ones of the LEDs 11 are simultaneously dimmed at this subsequent uniform rate below the threshold duty cycle value $PWM_{TH}$, the occurrence of the undesirable flickering effects described above is again substantially minimized or prevented.

Figure 9:
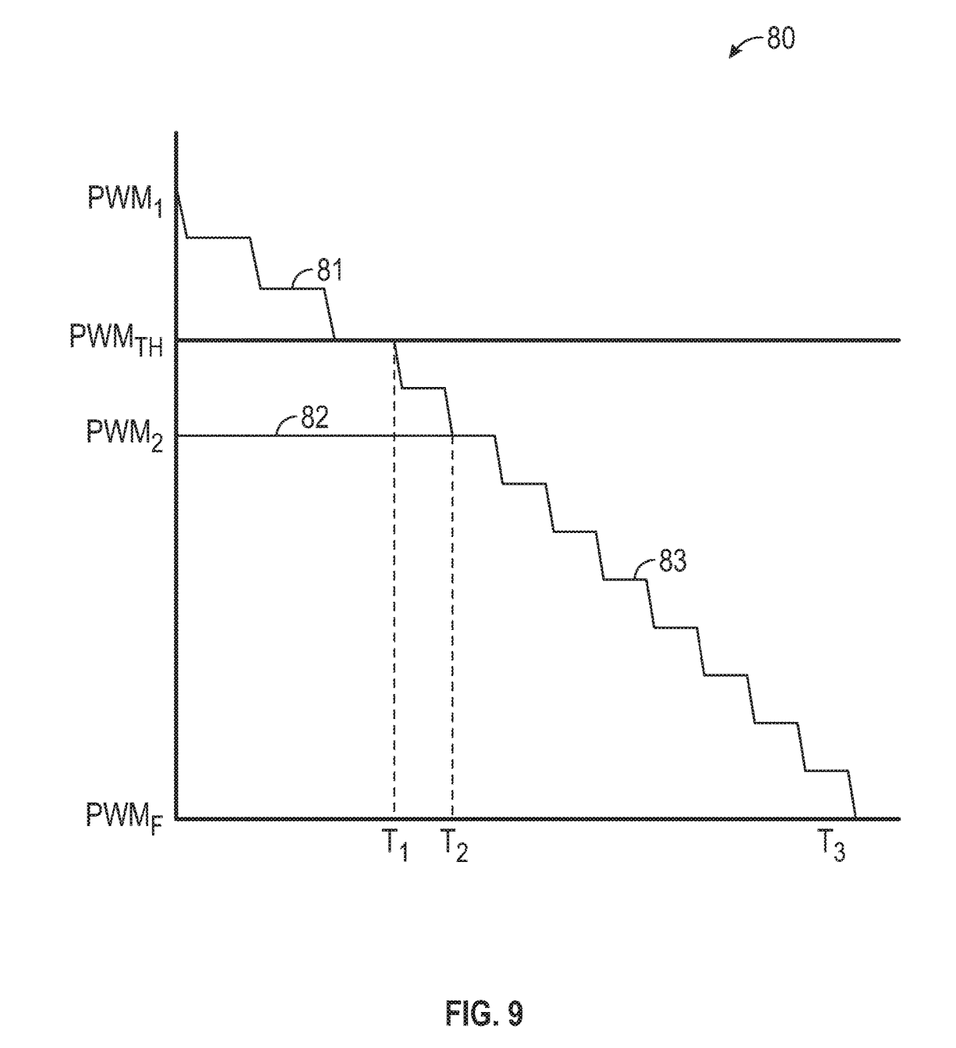
FIG. 9 is a graph that illustrates a sixth embodiment of a method of operating the LED array and the electronic circuit shown in FIGS. 1 and 2 in accordance with this invention.

FIG. 9 is a graph, indicated generally at 80, that illustrates a sixth embodiment of a method of operating the LED array 10 and the electronic circuit 12 shown in FIGS. 1 and 2 in accordance with this invention. The sixth embodiment of the method of operating the LED array 10 shown in FIG. 9 is similar to the fifth embodiment of the method shown in FIG. 8, and like reference numbers (incremented by ten) are used in FIG. 9. The sixth embodiment of the method differs from the fifth embodiment of the method only in that after the value of the duty cycle of the first one of the LEDs 11 achieves the value of the threshold duty cycle value $PWM_{TH}$ at the point in time $T_1$, the first one of the LEDs 11 is continued to be dimmed, but at a subsequent rate that is equal to the initial rate, as shown by a third plot line 83 in the graph 80. However, as mentioned above, the subsequent rate at which the PWM duty cycle value of the first LED 11 is dimmed may be selected as desired.

Although this invention has been described and illustrated in the context of dimming the amount of the brightness of light emitted by the LEDs 11, it will be appreciated that this invention may be used to change the amount of the brightness of light emitted by the LEDs 11 in any manner, including increasing the amount of the brightness of light emitted by the LEDs 11 or a combination of both increasing and decreasing the amount of the brightness of light emitted by the LEDs 11.

The principle and mode of operation of this invention have been explained and illustrated in its preferred embodiments. However, it must be understood that this invention may be practiced otherwise than as specifically explained and illustrated without departing from its spirit or scope.

What is claimed is:

1. A method of changing first and second pulse width modulation (PWM) control signals that are adapted to operate respective first and second light emitting diodes (LEDs), the method comprising the steps of:
    (a) changing a first PWM control signal, adapted to operate a first LED, from a first initial PWM value at a first rate of change to achieve a threshold PWM value at a predetermined point in time;
    (b) changing a second PWM control signal, adapted to operate a second LED, from a second initial PWM value at a second rate of change to achieve the threshold PWM value at the predetermined point in time; and
    (c) subsequent to the predetermined time, changing both the first PWM control signal and the second PWM control signal from the threshold PWM value to achieve a final PWM value.

2. The method defined in claim 1 wherein step (a) is performed by changing the first PWM control signal from the first initial PWM value to the threshold PWM value.

3. The method defined in claim 2 wherein step (b) is performed by changing the second PWM control signal from the second initial PWM value to the threshold PWM value.

4. The method defined in claim 1 wherein step (c) is performed by changing both the first PWM control signal and the second PWM control signal at the same rate from the threshold PWM value to the final PWM value.

5. The method defined in claim 1 wherein step (a) is performed by changing a duty cycle of the first PWM control signal from the first initial PWM value to the threshold PWM value.

6. The method defined in claim 5 wherein step (b) is performed by changing a duty cycle of the second PWM control signal from the second initial PWM value to the threshold PWM value.

7. The method defined in claim 1 wherein step (c) is performed by changing both the first PWM control signal and the second PWM control signal to achieve a final PWM value.

8. The method defined in claim 1 including the further steps of:
    (d) maintaining a third PWM control signal, adapted to operate further LEDs, at a third initial PWM value until the first PWM control signal and the second PWM control signal achieve the third initial PWM value; and
    (e) subsequently changing all of the first, second, and third PWM control signals to achieve the final PWM value.

9. The method defined in claim 1 wherein step (c) is performed by ceasing to change one of the first PWM control signal and the second PWM control signal before it achieves the final PWM value.

10. The method defined in claim 1 wherein step (c) is performed by changing both the first PWM control signal and the second PWM control signal from the threshold PWM value at a third rate that is not equal to either the first rate or the second rate.

11. The method defined in claim 1 wherein step (c) is performed by changing both the first PWM control signal and the second PWM control signal from the threshold PWM value at a third rate that is equal to the first rate.

12. The method defined in claim 1 wherein the threshold PWM value is sufficiently high such that undesirable flickering effects described are substantially minimized or prevented.

* * * * *